United States Patent [19]

Clapp

[11] Patent Number: 4,845,643

[45] Date of Patent: Jul. 4, 1989

[54] SIMPLIFIED COMPUTER GRAPHICS PERSPECTIVES

[76] Inventor: Roy A. Clapp, 2505 S. Kiwanis Ave., #352, Sioux Falls, S. Dak. 57105

[21] Appl. No.: 851,231

[22] Filed: Apr. 14, 1986

[51] Int. Cl.$^4$ .............................................. G06F 15/62
[52] U.S. Cl. .................................... 364/518; 340/729; 364/521; 364/522
[58] Field of Search ............... 364/512, 518, 521, 522; 340/723–725, 727, 732, 729

[56] References Cited

U.S. PATENT DOCUMENTS

| | | | |
|---|---|---|---|
| 4,275,449 | 6/1981 | Aish | 364/512 |
| 4,549,275 | 10/1985 | Sukonick | 364/521 |
| 4,694,404 | 9/1987 | Meagher | 364/518 |

*Primary Examiner*—Gary V. Harkcom
*Assistant Examiner*—H. R. Herndon

[57] ABSTRACT

A method for generating an accurate perspective drawing of an object as it would appear from a freely chosen viewpoint, utilizing only data from conventional plan and elevation drawings, arranged according to a prescribed way. This permits an architect or engineer to obtain one or more perspective views of a project which is in the design stage, using only the elevation and plan drawings, which are required anyway. Its practical application is to use a personal computer to carry out the steps of the process, especially if this method is integrated into an existing 2D CAD system. The geometrical and mathematical steps are such that anyone familiar with the software of such a system can provide a suitable routine to enable a user to employ the method. This method allows a change of viewpoint to be made, by simply entering information defining the new viewpoint. A unique additional feature of this invention permits plotting of the elevations upon a cardboard strip, which can be folded into a physical model of the object's selected surfaces. The original data is retained unchanged, so that the conventional plan and elevation views can be plotted at any later time.

7 Claims, 5 Drawing Sheets

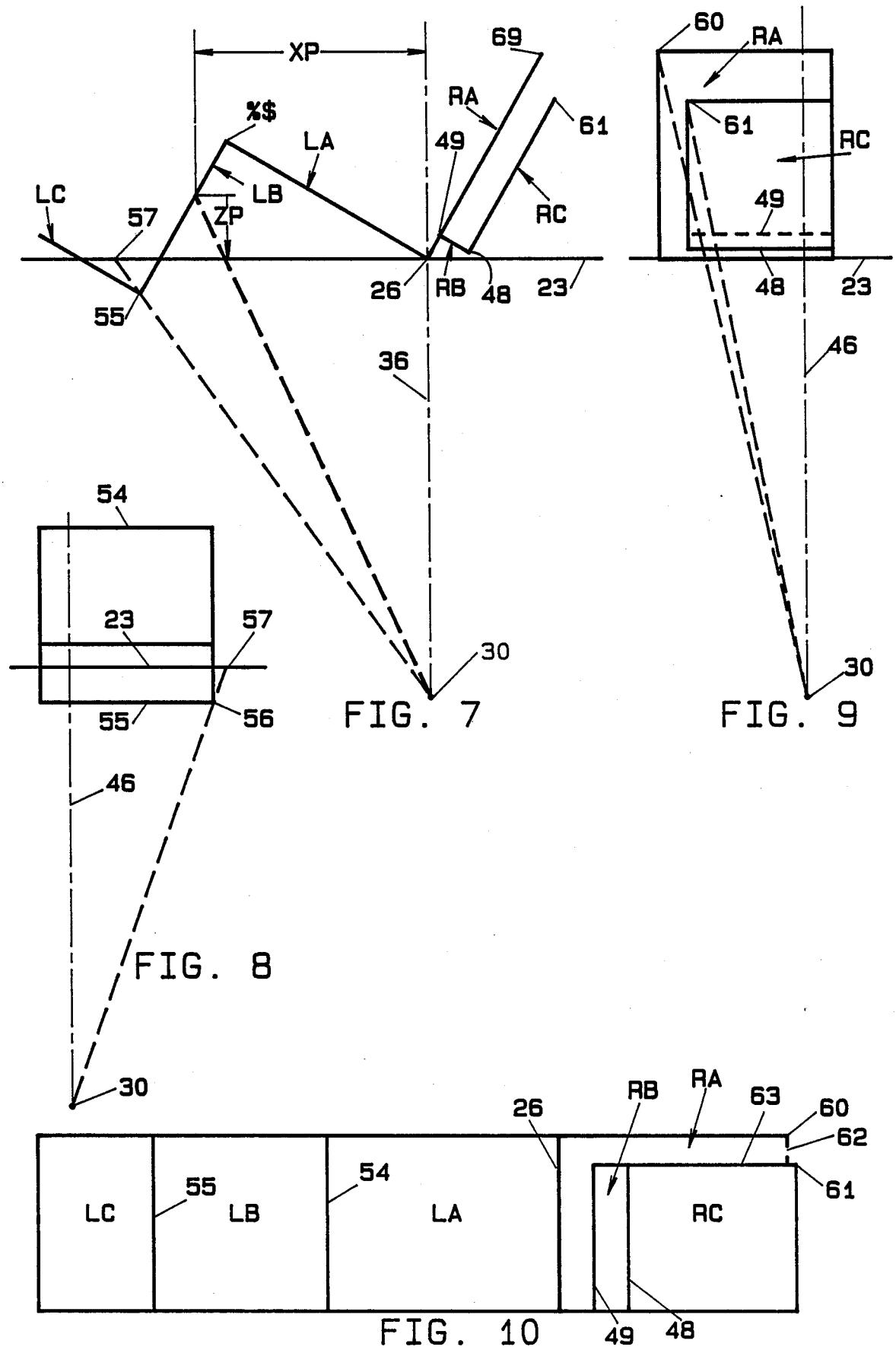

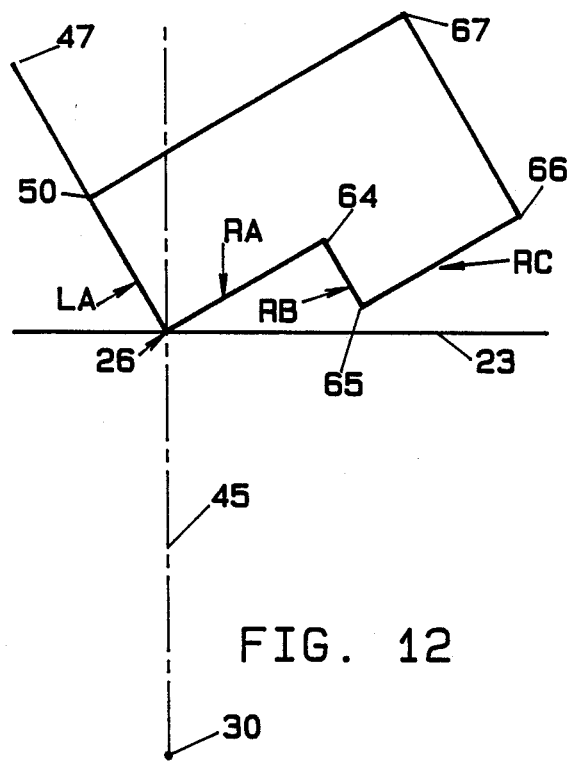
FIG. 12
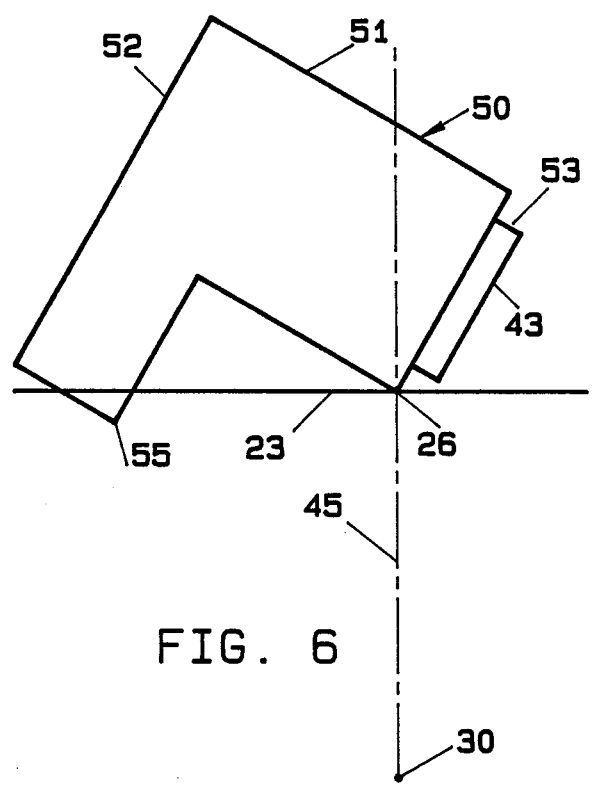
FIG. 6
| LOCATION | X VALUE | Z VALUE |
|----------|---------|---------|
| 26 | 0 | 0 |
| 47 | -20.000 | 34.6410 |
| 59 | -10.000 | 17.3205 |
| 64 | 21.6506 | 12.5000 |
| 65 | 26.6506 | 3.8398 |
| 66 | 48.3013 | 16.3398 |
| 67 | 33.3013 | 42.3206 |
FIG. 15
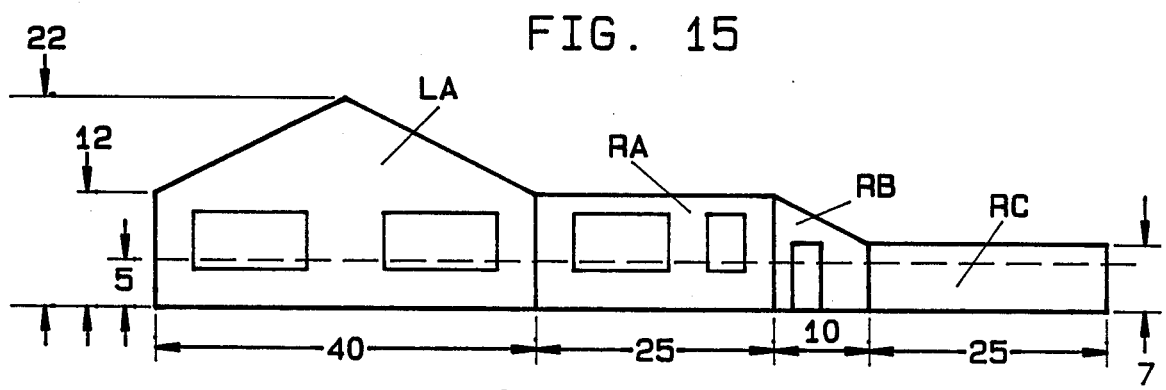
FIG. 13

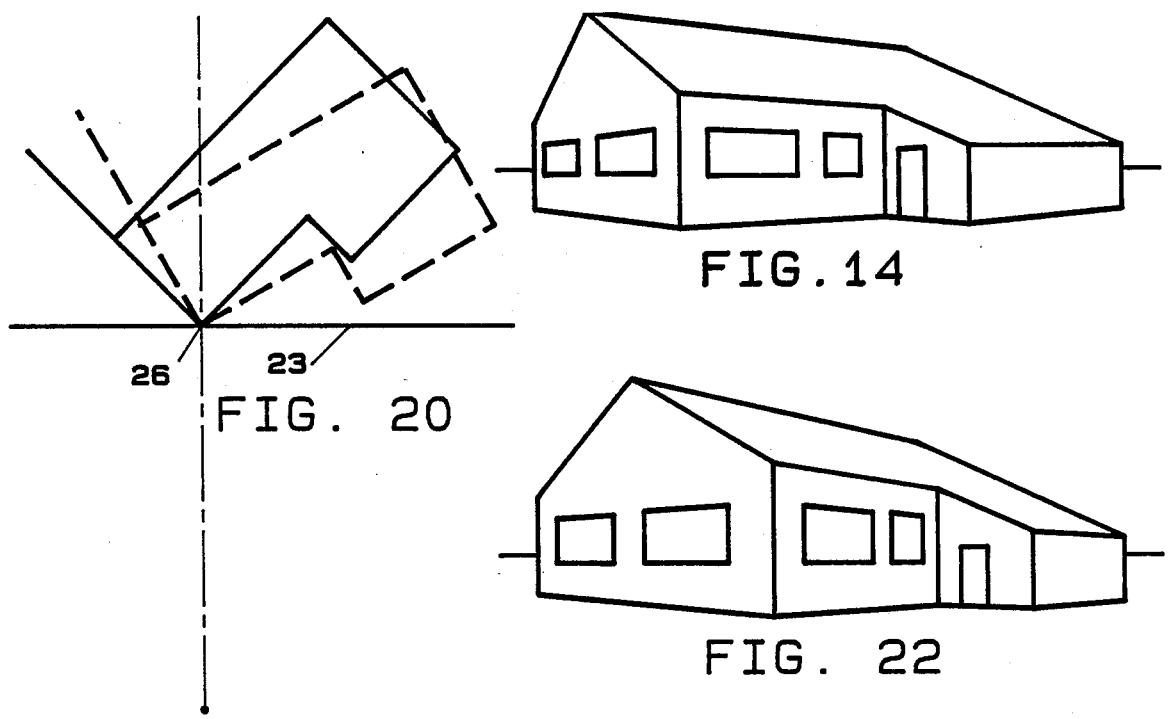
FIG. 14
FIG. 20
FIG. 22
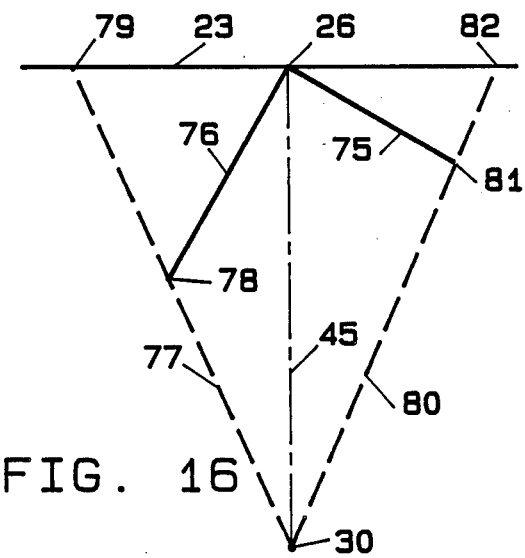
FIG. 16
| LOCATION | X VALUE | Z VALUE |
|---|---|---|
| 26 | 0 | 0 |
| 47 | −28.284 | 28.284 |
| 59 | −14.142 | 14.142 |
| 64 | 17.678 | 17.687 |
| 65 | 24.749 | 10.607 |
| 66 | 42.426 | 28.284 |
| 67 | 21.213 | 49.487 |
FIG. 21

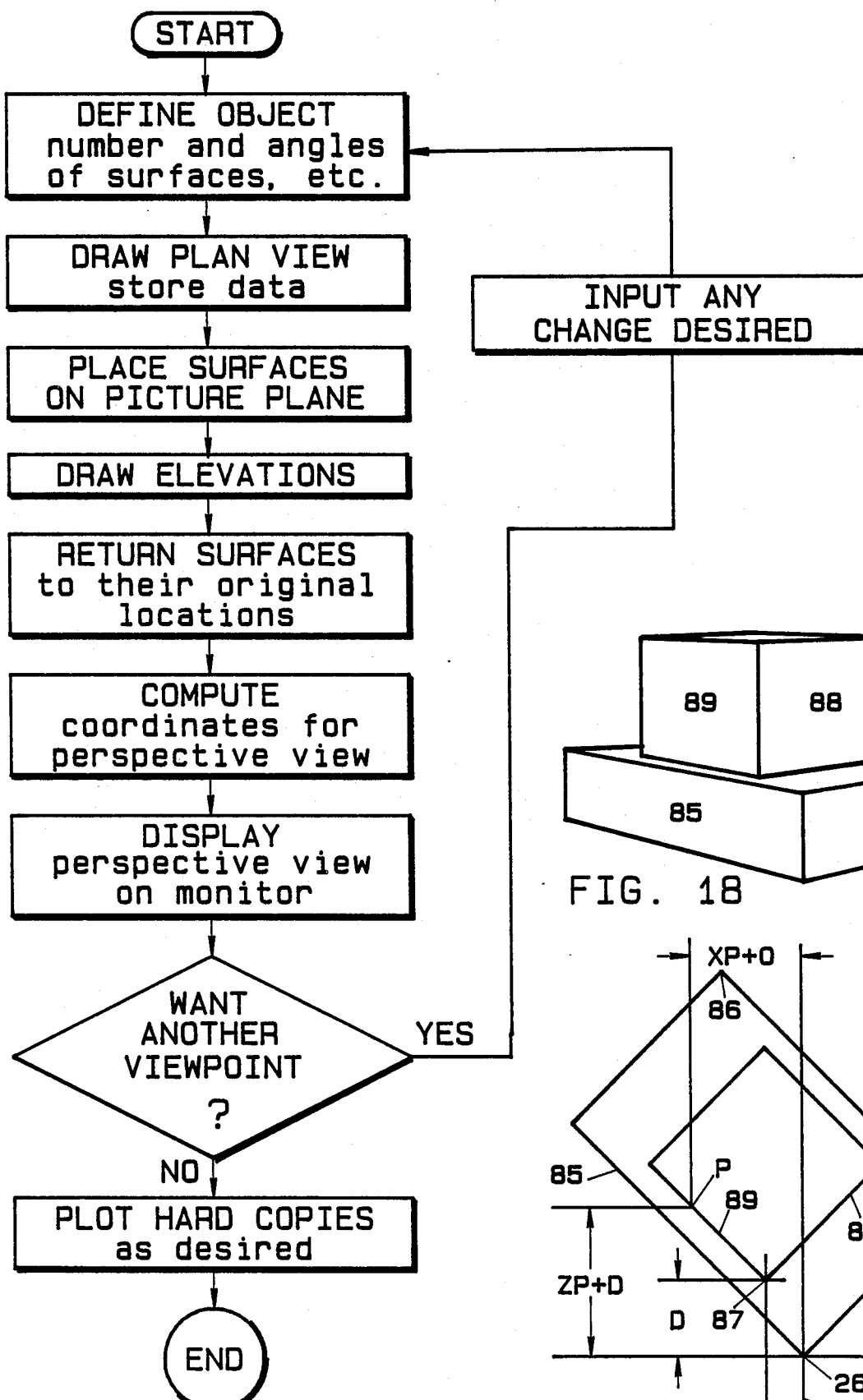

SIMPLIFIED COMPUTER GRAPHICS PERSPECTIVES

BACKGROUND OF THE INVENTION

Personal computers are equipped with graphics capabilities, which the user can control with commands in Basic language. This permits making line drawings which are displayed on the monitor screen. The fundamental principle is to define, in Cartesian coordinates of x and y, the location of a point where a line starts, and the location for its end. Circles can be displayed by entering the appropriate command and specifying the location of its center, with its radius. However, circles, and other curves are actually executed by multiple short straight line segments, so that a circle is really a multi-sided polygon.

The coordinates entered during the creation of a drawing can be stored in the memory chips of the computer, if desired.

A variety of software programs are now available, such as Versacad 5.0, developed by Versacad Corporation, Huntington Beach, CA, which greatly extend the graphics capability described above. The origin of a two dimensional coordinate system can be placed anywhere on the monitor screen, and a large selection of image elements, such as a line, a circle, or a rectangle, can be selected from a menu. The size and placement of these elements are entered by specifying their x and y coordinates. The coordinates can be entered in a variety of ways, including by keyboard, by joystick, by a probe with a digitizing tablet, or by a 'mouse'.

These picture elements can be moved around, combined, and otherwise manipulated as required, to produce any desired drawing.

Vendors offer add-on software, extending the capabilities of the 2D systems.

It is the custom of CAD vendors to use the term 3D for what should be correctly called perspective drawings. Herein the term 3D will be retained in references to prior art, but the correct term will be applied to the product of this invention.

Current 3D systems first produce what has been called "wire drawings", in which hidden detail is mingled with the desired visible, then the computer calculates which lines to retain and which should be erased, then finally removing the unwanted lines to produce a solid appearance. This is inefficient, requiring (1) the input of data which is later discarded, (2) a complex program capable of distinguishing between the required visible and the unwanted invisible lines, and (3) finally performing the erasure. All of this requiring a large computer memory, and is wasteful of human and computer time.

This invention discloses a method for producing an accurate perspective drawing of an object. While it can be used with a personal computer, or even by pencil and paper, it is especially adapted to be operated in conjunction with a modified CAD system.

The geometrical and mathematical steps which comprise this invention converts an original set of data, employed for the usual orthogonal elevation and plan views, into a second set of data used to make the perspective drawing.

Hence, it can be understood this invention is not a computer program, but is a method comprised of a series of steps, well adapted to be executed by a relatively short program segment inserted into a commercially available CAD software system.

The software of all commercial CAD systems are carefully guarded trade secrets, but the general fundamentals, described elsewhere in this disclosure are well known. Since different programmers will differ in the program they may write to accomplish a given task, there can be a variety of routines by which this method can be integrated into a particular CAD system.

SUMMARY OF INVENTION

The method of utilizing computer graphics to create a perspective drawing of an object, comprising the steps of:

a. choosing a reference viewpoint of the object corresponding to the desired perspective view;

b. defining a coordinate system corresponding to said viewpoint;

c. drawing orthogonal plan and elevation views representing all surfaces visible in the desired perspective view, said plan and elevation views corresponding to a first set of coordinates in said coordinate system;

d. generating from the first set of coordinates, a second set of coordinates representing the perspective view; and e. drawing the perspective view based on said second set of coordinates.

BRIEF DESCRIPTION OF DRAWINGS

FIG. 6 is a plan view of a more complex subject, with picture plane and reference line indicated.

FIG. 7 is a diagram of the object of FIG. 6 including only the surfaces visible from a selected viewpoint.

FIG. 8 is a left side view of FIG. 7.

FIG. 9 is a right side view of FIG. 8.

FIG. 10 is a diagram of the surfaces of FIG. 7, arranged as a strip, preparatory to creating their respective elevations. with a hinge line and fold lines serving as x references.

FIG. 12 is a diagram of a house with a pitched roof, in plan view, with visible surfaces only.

FIG. 13 is the dimensioned elevation views arranged as a foldable strip.

FIG. 14 is the perspective view produced from the plan of 12, with the elevations of FIG. 13.

FIG. 15 a table of coordinates, illustrating the accrued values produced in relocating the elevations to their respective positions on the plan view of FIG. 12.

FIG. 16 is an example of a picture plane behind the subject.

FIG. 17 is plan view of an object illustrating certain variations for solution.

FIG. 18 is the perspective view of the object in FIG. 17

FIG. 19 is a flow chart for a simple program to implement this invention.

FIG. 20 is a diagram illustrating the subject of FIG. 12 rotated to provide a change of viewpoint.

FIG. 21 is a revised table of accrued values corresponding to the rotation shown in FIG. 20.

FIG. 22 is the perspective corresponding to the changed viewing angle of FIG. 20.

PREFERRED EMBODIMENT OF THE INVENTION

This invention may be practiced by employing the drafting procedures of an existing CAD system, in combination with incorporating a routine into the CAD software for performing the mathematical steps embodied in the equations specified hereinafter.

The perspective drawing produced by this method corresponds to a photograph of an object, taken by a view camera, located at the viewpoint (30), with the film plane in a vertical position.

This method employs a CAD system to draw conventional plan and elevation views of a desired object, arranged in accordance with certain rules presented hereinafter, utilizing the input of x and y coordinates, then connecting these points by lines to represent the desired details.

A unique and valuable feature of this method is the way the multiple elevation views are displayed on the computer monitor in side by side relation; as if upon a strip of cardboard, which could be folded along lines between the individual elevations.

This feature not only makes it easy to understand and visualize the results, but the strip of connected elevations actually can be plotted to allow folding into a physical model of the selected surfaces. This feature permits management or clients to see a proposed object in a more comprehensive way. It also can serve as the foundation for a model constructed for public display.

The principle of this invention can be explained in conjunction with FIGS. 1 through 4.

Figure 1:
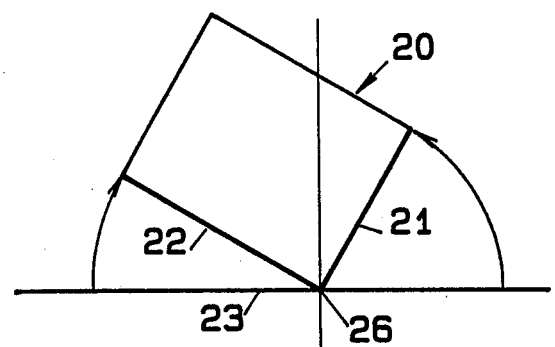
FIG. 1 is a plan view of an object, with a frame of reference, for which a perspective drawing is desired.

In FIG. 1, an object (20) is represented in plan view. For this example we will choose to consider it a small building.

An observation point (30) is chosen as desired. From there an observer could see the two walls, (21) and (22). Two reference lines are added to this plan view. A one along a line of sight (45) between the observation point and extending through the corner of the building. And a second line (23), perpendicular to the first line, which passes through the corner (26) of the building (20), designated as the picture plane. This is the geometric plane where the perspective drawing will be formed, and in a practical sense represents the face of the computer monitor screen.

These lines are used to define a set of three dimensional Cartesian coordinates. The common point of origin for the coordinates is the corner of the building, which coincides with the intersection of the picture plane (23) and the reference line (45). The picture plane defines the x axis, so every measurement to the left of the corner is negative in sign, and to the right has a positive value. The reference line defines the z axis, with the distance from the origin to the observer being assigned the algebraic variable ZV which is negative in sign. The corner of the building is designated as the hinge line, for reasons which will become clear.

Figure 2:
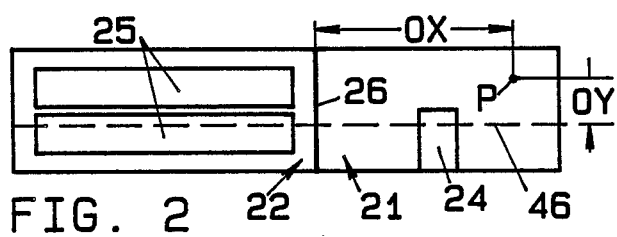
FIG. 2 is the elevation views of the surfaces which will be visible from the selected viewpoint.
Figure 5:
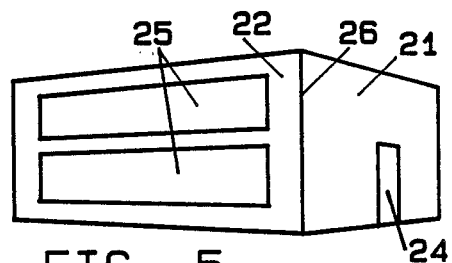
FIG. 5 is a perspective view produced by the method of this invention.

Referring momentarily to FIG. 2, the elevation views of walls (21) and (22), arranged side by side, have a common boundary, the hinge line (26). A dashed line indicates the origin of the y coordinate. Distances above this line are positive, while those below the line are negative in sign.

The subject can be positioned at any angle with respect to the picture plane, for this example, the object is turned so that surface 21 is positioned at an angle of 60 degrees counter-clockwise from the picture plane. The subject, being rectangular, will have surface 22 positioned at a clockwise angle of 30 degrees from the picture plane.

According the the method of this invention, the elevation views must be created with the wall surfaces 21 and 22 positioned normal to the reference line. We may visualize the hinge line acting a pivot, and the surfaces rotated to lie side by side on the picture plane.

Using a CAD system, according to the instructions of the particular system, the required x and y coordinates are entered to construct the elevation drawings as shown in FIG. 2, on the monitor screen. (The dashed line, used only for explanation purposes, is not part of this drawing). All CAD systems store and retain these coordinates, which constitute the first set of coordinates according to this invention.

A doorway (24) is part of elevation of wall (21), and two decorative panels (25—25), are part of wall (22). A generalized point (P) at coordinates OX and OY, is included to represent any desired point in such a drawing. This point is included for purposes of the explanation which follows, and is not part of the drawing required to create a perspective drawing of the subject.

Starting with this original set of coordinates, the generation of a second set of coordinates, representing the perspective view, can be performed by the computer as a single operation, but will be easier to understand if examined as two consecutive changes.

Figure 3:
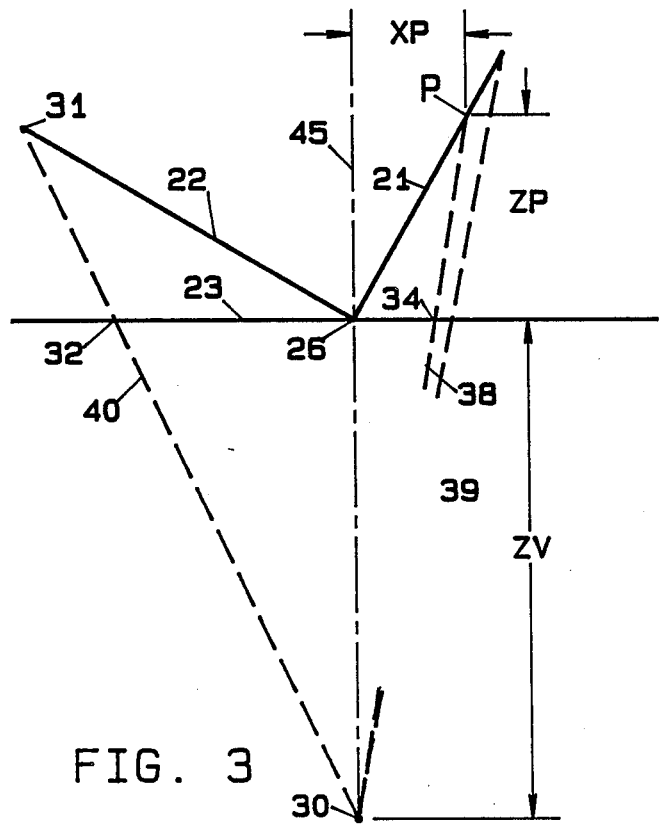
FIG. 3 is a diagram used to show how a second set of x coordinates corresponding to a perspective view are generated from a first set of x coordinates corresponding to said elevations.

The derivation of the mathematical equations used will now be explained with the aid of the diagrams of FIGS. 3 and 4. It will noted the FIG. 3 is a plan view similar to FIG. 1, containing walls (21 and 22), the picture plane (23), and the reference line (45), together with additional dashed lines (38,39, and 40) connecting the viewpoint (30) with points (P,31, and 42) on the object. The line penetrate the picture plane at point (34,32, and 36) respectively.

Figure 4:
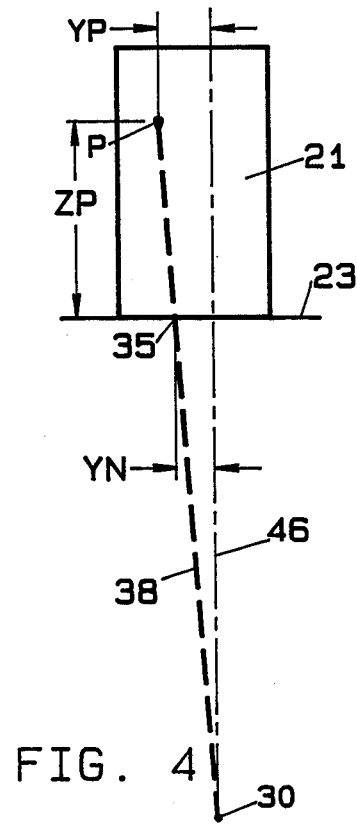
FIG. 4 is a diagram used to show how a second set of y coordinates corresponding to a perspective view are generated from a first set of y coordinates corresponding to said elevations.

The diagram in FIG. 4 is a side view of FIG. 3, revealing the location of the y coordinates. The light dashed line (46) represents the level of the viewpoint (30).

The heavier dashed line (38) connecting the general point (P) to the viewpoint, penetrates the picture plane (23) at point (35). The location of these points of penetration, using the same coordinate system established earlier, represent a second set of values, corresponding to the desired perspective view.

OX, OY, YP, ZP, ZV, XN, and YN represent geometric distances in FIGS. 2, 3, and 4.

It is assumed the elevation drawings of FIG. 2 have been executed, with the x and y coordinates stored, and the elevations now occupy their true position, as if they had been rotated from the picture plane with the hinge line serving as a pivot.

The relocated point (P) has now moved closer to the extension of the line (45), and consequently has a new x coordinate, XP. The same being true of every other x coordinate contained in the original set. Concurrently, point (P) has now moved away from the picture plane, the origin for the z coordinate, taking a new value ZP.

The diagrams of FIGS. 3 and 4 illustrate two separate transformations of the coordinates. The first intermediate step occurs due to the rotation of the surfaces. The direction and magnitude can be determined by the equations:

$$XP = \text{cosine } A * OX, \tag{1}$$

$$ZP = \text{sine } A * OX, \text{ and} \tag{2}$$

$$YP = OY. \tag{3}$$

The basic computer language symbol * is used to denote multiplication, A=the angle of rotation from the picture plane, in which counter-clockwise rotation takes a positive sign, and clockwise is considered negative.

Applying these equations to the present example, XP is obtained by multiplying the cosine of 60 degrees by the value of OX. Since the cosine of 60 degrees is 0.500, XP is half the distance from the reference line, as the entered data OX.

But the point has also moved away from the picture plane by the amount of the sine of 60 degrees, which is 0.8660 times the value of OX. This has altered the location in the z direction as denoted by the variable ZP. The value of $ZP = 0.866*OX$. The height (OY) of the point (P) above the y origin is not affected by rotation, but to avoid confusion is now assigned a different variable, YP, which equals the value of OY.

The next intermediate step which will generate a final set of coordinates serving to produce the perspective view, will now be explained. Because the computer performs both intermediate steps as a single routine, this set is designated as the second set of coordinates elsewhere in these specifications.

The second intermediate step consists only of projecting every point of the elevations back through the picture plane to the observation point (30), and calculating the x and y coordinates for the points of penetration at the picture plane (23).

FIG. 3 shows certain dashed lines of sight. One of these (40) extends from the viewpoint 30, to a point (31) at the end of wall 22. Its path intersects the picture plane 23 at location (32). Likewise, a line of sight (39), extends from the viewpoint to a point (42) at the end of wall 21. This line of sight intersects the picture plane at location (36).

The collective location of all the points on the picture plane provide the set of coordinates of the perspective view of the object.

It is well known that a perspective view is based upon an object appearing smaller in proportion to the distance between the object and the viewer. Thus, if one telephone pole is twice as far from the viewer as another, it will appear to be half as tall.

The total distance from the viewpoint 30 to a point on the object, along the z axis of the reference line 45, is the sum of the absolute value of ZV combined with ZP. Because ZV is negative in sign, this distance is written algebraically as: ZP−ZV. The relation between XP and XN is the ratio of our equation (4), −ZV/(ZP−ZV). Thus, $XN = XP*(-ZV/(ZP-ZV))$.

YP is unchanged by rotation, so $YN = OY*(-ZV/(ZP-ZV))$.

Having presented the equations it will be helpful to complete understanding to examine the diagrams of FIGS. 3 and 4, in connection with the conversion of XP and YP to the coordinates on the picture plane, XN and YN, respectively.

It is in this stage that both the vertical heights (y) and the horizontal dimensions (x) are reduced in proportion to their distance from the viewer. In other words, this is a key stage in the creation of the coordinates for the perspective view.

The same line of sight 38, appears in both FIGS. 3 and 4, connecting the point P with the viewpoint, which is shown to be beyond the picture plane 23 by the distance ZP. In other words, it shows the distance from viewer to P as the sum of the two components ZV and ZP. Since the sign of ZV is negative the term ZP−ZV has now been demonstrated.

The line of sight coverage with respect to the reference line, both horizontally and vertically, as it approaches the viewpoint. Consequently the coordinates at the picture plane XN and YN are reduced in value over the more distant XP and YP.

Let U represent the included angle between the line of sight and the reference line. Then $XP = \text{Tan } U*ZP-ZV$ and, $XN = \text{Tan } U*-ZV$. This shows that the dimensions are in the same ratio as the ratio of the distance −ZV is to ZP−ZV. The identical logic applies to the ratio of YP and YN, which proves that equation (4) presented earlier, conforms to the law of perspectives.

The validity of equation (4) might be questioned because the distance along the line of sight 38, from the viewpoint to the intersection with the picture plane, and to point P is greater than along the z coordinate, represented by the reference line.

The answer is: while the distances are greater, the ratio of the distance from the viewpoint to the intersection 34, compared to total distance, viewpoint to P, is identical to the ratio of equation (4).

These are the only equations required, but there remains additional explanation about establishing the initial OX and OY for more complex subjects.

FIG. 6 represents the plan view of such a subject. The walls (50 through 53) will not be visible from the selected viewpoint. and it should be noted that one corner (55) of the ell extends in front of the picture plane 23.

It must be made clear that there is nothing about this invention that limits making plan and/or elevations only to those visible from a selected viewpoint. Standard operating practice would normally be followed, but for purpose of simplifying the present explanation, only the essential surfaces are used.

The visible walls are diagrammed in FIG. 7 in relation to the picture plane 23, and the reference line 45. There are three surfaces on each side of the hinge line 26. Surfaces connected to the hinge line will be termed "primary surfaces", and those not directly connected, will be termed, "secondary surfaces". The primary surfaces are here designated RA and LA. Of the remaining secondary surfaces, those on the left are LB and LC, and on the right, RB and RC.

FIGS. 8 and 9 show the left side and right side views of this subject. It will be noted in FIG. 9 that the height of surfaces RB and RC are lower than the main structure.

This is also clear from examining FIG. 10, which shows the various surfaces laid out side by side, in the form of a continuous strip. The hinge line 26 forms the zero reference for the x and z coordinates for the primary surfaces LA and RA, as in the previous example. The z coordinates are 0 because all surfaces are now on the picture plane.

But when additional surfaces are included in the strip, their boundaries are defined as fold lines. In the present example 48, 49, 54 and 55 are such fold lines.

Surfaces RB and RC extend from surface RA, as seen in FIG. 7. This is an example of the benefit of thinking as if drawing the elevations on a strip of cardboard. These elevations could be drawn as two separate strips. But they also can be drawn on a single strip, as shown provided line 63 is slit so RB and RC can be bent out from RA when the elevations are completed and relocated.

The following rules allow almost any object to be drawn as a perspective representation.

Rule one: Every fold line starts a new zero reference for the x coordinate for the next surface beyond it. Thus, fold line 54 serves surface LB as the x reference, in the same way the hinge line acts as reference for surface LA; while fold line 55 is used as the x reference for surface LC. Likewise, fold line 49 is the x reference for surface RB, and fold line 48 is the reference for RC. The reference fold line for any secondary surface is the one nearest the hinge line.

Rule two: An attachment line serves as an alternate to a fold line, and is subject to the same use as a zero reference for the x coordinate. In FIG. 10, the line 49 could have been an attachment line by imagining the surfaces RB and RC being drawn on a separate strip, then attached to surface RA when all the surfaces are relocated. This would have been necessary if the eyelevel had been raised, so that a roof had been visible.

Rule three: When surfaces are relocated, x and z coordinates for any secondary surface are combined with the values of the preceding surface.

Corollary one: Because the sign of the x coordinate of the secondary surfaces ordinarily agree with the sign of the preceding surfaces, their combination usually increases the magnitude of the x value as points are located further from the hinge line. An exception can occur when the top surface of an object is shown.

Corollary two: Because after relocation, the sign of z can agree with or differ from the sign of its reference line, the z value may increase or decrease from that of the preceding reference line.

To examine the way these rules apply, refer to FIG. 7. In which, reference line 45, beginning at the viewpoint 30, extends through the hinge line 26, which is the boundary between the surfaces on the left, LA, LB, and LC, and the surfaces on the right, RA, RB, and RC. Certain points are designated, which allows some points to be correlated to fix their position on FIGS. 8, 9, and 10. Point 60 is thus located at the top, right hand tip of surface RA. Point 61 is thus located at the top, right hand tip of surface RC.

According to this invention, the customary beginning is made by laying out, side by side in a continuous strip, the several surfaces in the same order as they occur in the subject structure. The elevation drawing for each surface is performed, starting with one of the primary surfaces, and proceeding to the next secondary surface. The x coordinates are retained for the end of each surface, but the fold line starts the next surface with x=0, according to Rule one.

When all of the elevations on one side of the hinge line are drawn, the remaining elevations are completed, always starting at the hinge line, working outward, starting x=0 at each fold line, but being certain to retain the value of the x coordinate for the end of each preceding surface.

In FIG. 8, after relocation, the top of the fold line 55, projects backward to point 57 on the picture plane, making it larger than the actual fold line itself. Also, it will be displaced further from the reference line since this point 57 projects to the left of the fold line 55, as seen in FIG. 7.

In FIG. 9, points 60 and 61 are connected to the viewpoint by lines of sight in exactly the same way that occurred in our first example.

A general point P is shown upon surface LB, XP will be the x value of surface LA at fold line 54, combined with the contribution of the x distance of the point on LB, the latter being: OX * cosine of the angle of rotation for LB. In other words the dimension of XP is the combination of the horizontal distance of fold line 54 from the reference line, and the horizontal distance of the point on LB from the same fold line 54.

Likewise, ZP is the combined value of the z coordinate of the fold line, with the z contribution of the LB surface. In this case the signs being different, the point P is closer to the picture plane, than the fold line 54.

Note should be taken that the surfaces RB and RC will mask a large area of RA in the perspective, especially because the eyelevel is well below the top of surfaces RB and RC. The precise area could be calculated, but there is a simple way to avoid this. In drawing the elevations as in FIG. 10, simply omit line 62, and add it in the finished perspective.

Some addition or erasing in the finished perspective will greatly simplify the drafting work by eliminating extra calculations.

When all the elevations have been completed, the equations simulate the two steps, (a) relocating the elevations to the original position, and (b) generating the coordinates which form the perspective view in a single mathematical operation using the formulae presented earlier.

Figure 11:
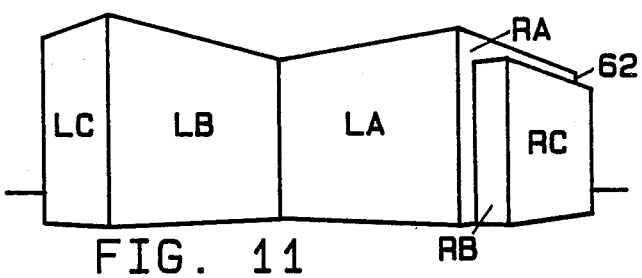
FIG. 11 is a perspective view of the surfaces displayed in FIG. 10.

FIG. 11 shows the walls as they appear in perspective. Note that the line 62 was added manually.

Another example, with numerical data, will offer additional variations. FIG. 12 is a diagram in plan view of a house with a pitched roof, showing only the visible surfaces. FIG. 13 is the layout of the elevations, with key dimensions.

The table of FIG. 15 provides the accrued x and z values for different key points noted in FIG. 12, after the elevations have been relocated, (window and door details omitted). The perspective of FIG. 14 is the result of these values, acted on by equation 4.

Since all the entry data is retained, if a different viewing angle is desired after examining this perspective view on the monitor screen, or even after plotting hard copies, it is only necessary to enter the change in angle and rerun the program.

To describe this in more detail, suppose it is decided that a new viewing angle of 45 degrees would be preferable to the original +30 degree of RA (and −60 degree of LA). FIG. 20 shows this change with the original plan view of FIG. 12 in dashed line, and the same plan view in heavier solid line, rotated an additional +15 degrees To obtain a new perspective drawing from this different viewpoint, it is only that the original orientation of the plan view be altered by entering the desired change of angle. This +15 degrees is added algebraically to each of the angles originally entered, and the program rerun.

Changing the viewing angle does not change any of the elevations, but does produce different x and z coordinates upon relocation, consequently new accrued values, as shown in the table of FIG. 21. Rerunning the program with the altered angular data results in the new perspective view of FIG. 22.

In a similar manner, the initial eyelevel can be altered by algebraically adding a chosen positive or negative increment to the y coordinate. Also a different viewing distance can be entered a replacement ZV.

FIG. 16 illustrates a diagram in which the picture plane is behind the subject, which would be the case for an interior. Two walls 75 and 76 are joined by the hinge line 26. After the elevations are drawn with the surfaces on the picture plane they must be rotated forward of the picture plane 23, consequently point 78 projects back to the picture plane 23 to point 79. Point 81 projects back to point 52. The resultant perspective is larger than the subject, but of course, can be scaled down as required.

FIG. 17 is a plan view of an object, composed of two components, one supported on the other. It can be set up as two separate strips of elevations. The purpose of this example is to show how offsets in the x and z directions can be handled. The answer is simple. The fold line 87 serves the secondary surfaces 88 and 89. It has x=0 for drawing the elevations. But these values, after repositioning, must have their values combined with the offsets O and D. The selection of a higher eyelevel, allows the top surfaces to be seen in the perspective view of FIG. 18.

The top surface of the lower component is initially drawn by connecting the lines from point 91 and 92 to the back corner 86. Then after the perspective view has been produced by the computer, points 94 and 95 were established at the end of their visible portion, afterwards the remainder of these lines were erased. This provides another example of a manual modification employed to preserve the simplicity of software.

GENERAL PROCEDURE FOR USE

A. Define object in relation to reference system, by input of number, size, and disposition of visible surfaces of the object, selecting one corner as a hinge point, selecting a viewpoint and eyelevel at a designated distance ZV from hinge line, erecting the reference line and picture plane, displaying this in plan view.

B. Having the computer calculate and store the x and z coordinates of preceding surfaces for each of the fold lines.

C. Layout strip of surfaces in side by side contact, using dimensional data input in step one. Draw elevations starting at one primary surface, continuing to any adjacent secondary surfaces until all elevations are completed on the same side, then go back to the other primary surface and repeat the procedure, until all surfaces have been completed.

D. The information input in the preceding steps forming a first set of coordinates.

E. Rotate elevations to occupy their respective places on the object.

F. Computer applies the equations described, to generate the second set of coordinates, corresponding to the perspective drawing.

G. Using this second set of coordinates to display the desired perspective view on the computer monitor.

H. Deciding if acceptable or if not, returning to modify input, followed by rerun.

I. Upon final acceptance, plotting whatever hard copies are required: of the perspective view, the plan view, and/or the elevations. The latter, in the form of a foldable strip, or as separate views of the individual elevations.

FIG. 19 is a flow chart of a computer program suitable to implement this invention, which is self explanatory.

Having described the invention in detail, I claim:

1. A method of drawing a perspective view of an object, comprising the steps of:
   a. selecting a reference viewpoint including an eyelevel, distance, and viewing angle of the object corresponding to the desired perspective view;
   b. designating a corner of the object as a hinge line;
   c. establishing a reference line of sight from the selected viewpoint and extending through said hinge line;
   d. establishing a geometric plane at the hinge line normal to the line of sight, designating it the picture plane;
   e. defining a Cartesian coordinate system having x, y, and z axes with their common point of origin at the intersection of the line of sight and the hinge line;
   f. making a series of elevation views of selected contiguous surfaces joined side by side on the picture plane, said elevation views being in the same sequence as their corresponding surfaces of the object, retaining the coordinate data;
   g. relocating the completed elevations to occupy their corresponding places as depicted in a plan view of the object;
   h. calculating the altered x and z coordinates resulting from the relocation of said elevations;
   i. using the altered z coordinates to calculate a second set of coordinates corresponding to desired perspective view; and
   j. drawing the perspective view based upon said second set of coordinates.

2. The method of claim 1 wherein the data of the elevation views is retained for the production of additional perspective drawing, supplying new coordinates specifying a new viewpoint which alters one or more of the values used to generate the second set of coordinates thus producing a different perspective drawing, representing a different viewpoint.

3. The method of drawing a perspective view of an object, comprising the steps of:
   a. providing a plan view of said object;
   b. choosing a viewpoint at a desired height, distance, and angle from a corner of said object and constructing a reference line of sight from the viewpoint passing through the corner;
   c. designating the corner as the hinge line and establishing a geometric plane perpendicular to the reference line of sight at the hinge line, designating this as the picture plane;
   d. defining a coordinate system, using the intersection of the reference line of sight and the hinge line as its origin, wherein the x axis extends horizontally across the picture plane, the y axis extends vertically along the hinge line, and the z axis extends along the reference line of sight;
   e. using the x and y coordinates to draw elevation views of all surfaces visible from the selected viewpoint on the picture plane, said elevations being joined side by side in the same sequence as their corresponding surfaces in the object, retaining this first set of coordinate values;

f. performing mathematical operations on the first set of coordinate values to calculate new x and z values corresponding to repositioning of said elevation views to occupy their respective positions on the object, then using the altered z values to produce a second set of coordinates; and g. using said second set of coordinates to create a perspective view of the object.

4. The method of claim 3, wherein the mathematical operations are defined by the following equations:

(1) $XP = \text{cosine } A*OX;$ =(2) $ZP = \text{sine } A*OX$ =(3) $YP=OY;$ =(4) $F=-ZV/(ZP-ZV);$ = in which the symbol * is used to denote the operation of multiplication, OX and OY are the coordinate values for the location of any point on one of the elevations when said elevation lies on the picture plane, A is the angle of a surface of the object with respect to the picture plane, XP=distance along the x axis to said point when on the surface of the object, ZP= distance along the z axis to said point when on the surface of the object, equation (3) demonstrates the y value of the point on the surface of the object is the same as when it was on the elevation view lying on the picture plane, F= a conversion factor employed to convert the first set of coordinates to the second set of coordinates corresponding to the perspective view of the object.

5. The method according to claim 4, wherein the mathematical operations are performed in two steps, first step employing equations (1) and (2), and second step using equations (3) and (4).

6. Method according to claim 5, wherein elevations joined by the hinge line are designated as primary and any remaining elevations are designated as secondary, boundaries nearer to the hinge line of every such secondary elevation being designated as a fold line and assigned the value of x=0 for the adjacent secondary surface only.

7. The method according to claim 5 of 6, wherein a computer program is provided to perform the method steps.

* * * * *